(12) United States Patent
Lee et al.

(10) Patent No.: US 10,488,467 B2
(45) Date of Patent: Nov. 26, 2019

(54) APPARATUS AND METHOD FOR ESTIMATING REMAINING SERVICE LIFE OF BATTERY

(71) Applicant: LG CHEM, LTD., Seoul (KR)

(72) Inventors: Hyun-Chul Lee, Daejeon (KR);
Ki-Wook Jang, Daejeon (KR);
Jong-Min Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 382 days.

(21) Appl. No.: 15/317,626

(22) PCT Filed: Jul. 13, 2015

(86) PCT No.: PCT/KR2015/007258
§ 371 (c)(1),
(2) Date: Dec. 9, 2016

(87) PCT Pub. No.: WO2017/010583
PCT Pub. Date: Jan. 19, 2017

(65) Prior Publication Data
US 2017/0199248 A1  Jul. 13, 2017

(51) Int. Cl.
*G01R 31/367* (2019.01)
*G01R 31/392* (2019.01)
*G01R 31/36* (2019.01)

(52) U.S. Cl.
CPC ....... *G01R 31/367* (2019.01); *G01R 31/3646* (2019.01); *G01R 31/392* (2019.01)

(58) Field of Classification Search
CPC ............... G01R 31/367; G01R 31/392; G01R 31/3646; G01R 31/371
See application file for complete search history.

(56) References Cited

U.S. PATENT DOCUMENTS

| | | | | |
|---|---|---|---|---|
| 7,227,335 B2* | 6/2007 | Sakakibara | ........... | H01M 10/44 320/132 |
| 8,332,342 B1* | 12/2012 | Saha | .................... | G01R 31/392 706/45 |
| 9,048,514 B2* | 6/2015 | Newman | ............... | H01M 10/48 |
| 9,465,078 B2* | 10/2016 | Betzner | ............... | H01M 10/486 |
| 2016/0054392 A1 | 2/2016 | Lee et al. | | |
| 2017/0131364 A1* | 5/2017 | Hosaka | .................. | G01R 31/36 |

FOREIGN PATENT DOCUMENTS

| | | |
|---|---|---|
| JP | 2009-193919 A | 8/2009 |
| KR | 10-0713631 B1 | 5/2007 |
| KR | 10-2013-0083220 A | 7/2013 |
| KR | 10-2014-0085629 A | 7/2014 |
| KR | 10-2015-0065398 A | 6/2015 |

* cited by examiner

*Primary Examiner* — Mohamed Charioui
*Assistant Examiner* — Catherine T. Rastovski
(74) *Attorney, Agent, or Firm* — Birch, Stewart, Kolasch & Birch, LLP

(57) ABSTRACT

The present disclosure discloses an apparatus and method for estimating a remaining service life of a battery that enables providing a relatively exact remaining service life of the battery to a user even when a parameter of the battery does not change sufficiently enough to enable measurement of the remaining service life due to reasons such as the battery not being used or the like.

13 Claims, 4 Drawing Sheets

FIG. 3

| Elapsed time | Actual remaining service life | Naturally degraded remaining service life | Measured degraded remaining service life | Whether or not in use |
|---|---|---|---|---|
| 1 year | 98.5% | 99% | 98.51% | Used |
| 2 year | 97% | 98% | 97.01% | Used |
| 3 year | 96% | 97% | 96.01% | Not used |
| 4 year | 95% | 96% | 95.01% | Not used |
| 5 year | 94% | 95% | 94.01% | Not used |
| 6 year | 93% | 94% | 93.01% | Not used |
| 7 year | 92% | 93% | 92.01% | Not used |
| 8 year | 91% | 92% | 91.01% | Not used |
| 9 year | 89.5% | 91% | 89.51% | Used |
| 10 year | 88% | 90% | 88.01% | Used |
| ... | ... | ... | ... | ... |

APPARATUS AND METHOD FOR ESTIMATING REMAINING SERVICE LIFE OF BATTERY

TECHNICAL FIELD

The present disclosure relates to a technique of estimating a remaining service life of a battery, and more particularly, to an apparatus and method for estimating a remaining service life of a battery with improved reliability that enables providing a relatively exact remaining service life of the battery to a user not only when the battery is being used but also when the battery is not being used.

BACKGROUND ART

The recently increased demand for portable electronic products such as laptop computers, video cameras, mobile phones, and so on, and the development of energy storage batteries, robots, satellites, and so on started in earnest led into active researches on high-performance secondary batteries capable of repeated charging and discharging.

Currently, commercially available secondary batteries comprise nickel cadmium, nickel hydrogen, nickel zinc and lithium secondary batteries and so on. Among them, lithium secondary batteries have drawn much attention because of their advantages of little memory effect to allow unrestrained charging/discharging, as well as very low self-discharging rate and high energy density and so on, compared to nickel-based secondary batteries.

However, such secondary batteries naturally degrade over time or degrade due to repeated charging/discharging, thereby deteriorating their performance. Therefore, in using a secondary battery, a technique of quantitatively evaluating a service life of the secondary battery is required.

The remaining service life of a battery is a parameter that quantitatively represents a change in capacity characteristics of the battery, which enables a battery user to know about how much capacity of the battery remains in the battery. Such an SOH generally represents capacity of the battery in percentage (%). For example, the SOH being 97% means that the remaining service life of a battery is 97% compared to its initial state, in other words, a state where 3% of capacity degradation occurred.

Therefore, using the SOH, a battery user may replace the battery at an appropriate time point, and adjust the charge/discharge capacity of the battery according to the period of use of the battery, thereby preventing over-charge and over-discharge of the battery.

Meanwhile, there are a wide variety of methods for estimating such an SOH, for example, there exists a method of estimating the SOH using an internal resistance and temperature of the battery, and a method of estimating the SOH through a full-discharge test, etc. However, such a conventional SOH estimating method has a problem that there has to be a change in parameter of the battery (mainly, a change in an electrical parameter) to enable estimation of the SHO. That is, when the battery is charged/discharged, a change in parameter of the battery occurs sufficiently, but when the battery is not being used, a change in parameter of the battery does not occur sufficiently enough to enable estimation of the SOH. Therefore, when a state continues where the battery is not being used, the parameter of the battery does no change sufficiently enough to enable estimation of the SOH. This leads to a problem where SOH estimation of the battery is not performed, and thus a proper SOH cannot be provided to the user. That is, there occurs a problem where even when the battery is degraded as time elapses, the user is provided with not a changed SOH but a previously estimated SOH.

A particular problem is when the battery is not used for a long period of time. When the battery is not used for a long period of time, SOH estimation is not performed, and thus even if the battery is degraded sufficiently due to natural degradation, the user cannot be provided with the SOH where such natural degradation is reflected.

When the user uses the battery at a state where the battery has not been used for a long period of time as aforementioned, a change in parameter of the battery would occur at last at the time point the battery is used and SOH estimation would be performed, providing an SOH estimate value to the user. Here, since a degree of degradation caused by natural degradation is reflected, the user would recognize at last that the remaining service life of the battery has changed drastically.

As a result, the user may determine that the apparatus for estimating a remaining service life of a battery cannot be relied upon, or miscalculate that the battery has broken down. Due to the aforementioned, an unnecessary inspection may be made to determine whether the battery has broken down, and the battery may be replaced unnecessarily, and thus there is concern of wasting the costs.

DISCLOSURE

Technical Problem

A purpose of the present disclosure is to solve the aforementioned problems, that is, a purpose of the present disclosure is to provide an apparatus and method for estimating a remaining service life of a battery that enables providing a relatively exact remaining service life of the battery to a user even when a change in parameter of the battery is not sufficient enough to enable measurement of the remaining service life of the battery due to reasons such as the battery not being used and so on.

The other objectives and advantages of the present disclosure can be understood with the following description and more clearly with the embodiments of the present disclosure. Also, it should easily be understood that the other objectives and advantages of the present disclosure can be implemented by the means described in the claims and the combinations thereof.

Technical Solution

According to an aspect of the present disclosure, provided herein is an apparatus for estimating a remaining service life of a battery, the apparatus including: a naturally degraded remaining service life computing part configured to compute the naturally degraded remaining service life that represents the remaining service life of the battery where a naturally degraded degree is reflected; a measured degraded remaining service life calculating part configured to calculate the measured degraded remaining service life that represents the remaining service life of the battery calculated by measuring a parameter of the battery, sensing a change in the measured parameter, and then performing a computation based on the measured parameter; and an estimating part configured to estimate the remaining service life of the battery using at least one of the naturally degraded remaining service life and the measured degraded remaining service life.

The estimating part may compare any one of the naturally degraded remaining service life value and the measured degraded remaining service life value with a pre-estimated remaining service life value, and estimate the remaining service life of the battery.

More specifically, the estimating part may compare any one of the naturally degraded remaining service life value and the measured degraded remaining service life value with the pre-estimated remaining service life value to select a relatively small value, and estimate the selected value as the remaining service life of the battery.

The apparatus for estimating a remaining service life of a battery may further include a storage part configured to store the remaining service life of the battery. The estimating part may update the storage part with the estimated remaining service life of the battery, and store the same.

According to an embodiment, the naturally degraded remaining service life computing part may compute the naturally degraded remaining service life according to a pre-determined cycle, the measured degraded remaining service life calculating part may calculate the measured degraded remaining service life when the change is sensed in the parameter, and the estimating part may estimate the remaining service life of the battery when the naturally degraded remaining service life computing part performs the computation or the measured degraded remaining service life calculating part performs the calculating.

According to an embodiment, the naturally degraded remaining service life computing part may calculate the number of days elapsed from the day the battery was fabricated until a subject day for which the remaining service life is to be estimated using information on a date of fabrication of the battery and information on a date of the subject day for which the remaining service life of the battery is to be estimated, and compute the naturally degraded remaining service life of the battery using the calculated number of days elapsed.

The parameter may include any one of a current, a voltage, an SOC and an internal resistance.

The apparatus for estimating a remaining service life of a battery may further include a display part configured to display the remaining service life of the battery estimated by the estimating part.

The remaining service life of the battery may be expressed in a percentage with respect to an initial service life of the battery.

According to another aspect of the present disclosure, provided herein is a battery pack including the aforementioned apparatus for estimating a remaining service life of a battery.

According to another aspect of the present disclosure, provided herein is a method for estimating a remaining service life of a battery, the method including: computing a naturally degraded remaining service life that represents the remaining service life of the battery where a naturally degraded degree is reflected; calculating a measured degraded remaining service life that represents the remaining service life of the battery calculated by measuring a parameter of the battery, sensing a change in the measured parameter, and then performing a computation based on the measured parameter; and estimating the remaining service life of the battery using at least one of the naturally degraded remaining service life and the measured degraded remaining service life.

The estimating the remaining service life of the battery may compare any one of the naturally degraded remaining service life value and the measured degraded remaining service life value with a pre-estimated remaining service life value, and estimate the remaining service life of the battery.

More specifically, the estimating the remaining service life of the battery may compare any one of the naturally degraded remaining service life value and the measured degraded remaining service life value with the pre-estimated remaining service life value to select a relatively small value, and estimate the selected value as the remaining service life of the battery.

The method for estimating a remaining service life of a battery may further include storing the estimated remaining service life of the battery. Further, the storing the remaining service life of the battery may update the estimated remaining service life of the battery, and store the same.

According to an embodiment, the computing a naturally degraded remaining service life may compute the naturally degraded remaining service life according to a pre-determined cycle, the calculating a measured degraded remaining service life may calculate the measured degraded remaining service life when the change is sensed in the parameter, and the estimating the remaining service life of the battery may estimate the remaining service life of the battery when the naturally degraded remaining service life is computed at the computing of a naturally degraded remaining service life or when the measured degraded remaining service life is calculated at the calculating of a measured degraded remaining service life.

According to an embodiment, the computing a naturally degraded remaining service life may calculate the number of days elapsed from the day the battery was fabricated until a subject day for which the remaining service life is to be estimated using information on a date of fabrication of the battery and information on a date of the subject day for which the remaining service life of the battery is to be estimated, and compute the naturally degraded remaining service life of the battery using the calculated number of days elapsed.

The parameter may include any one of a current, a voltage, an SOC and an internal resistance.

The method for estimating a remaining service life of a battery may further include displaying the estimated remaining service life of the battery.

The remaining service life of the battery may be expressed in a percentage with respect to an initial service life of the battery.

Advantageous Effects

The present disclosure gives the following effects.

According to the present disclosure, even when the parameter of the battery has not changed sufficiently enough to enable estimation of the SOH due to reasons such as the battery not being used and so on, a relatively exact remaining service life of the battery may be provided to the user. That is, according to the present disclosure, it is possible to provide a highly reliable remaining service life of the battery to the user. Due to the aforementioned, it is possible to reduce the problem of unnecessarily inspecting or replacing the battery.

Further, according to an aspect of the present disclosure, it is possible to provide the user with an exact remaining service life of the battery by using various conventional SOH estimation methods when the battery is being used.

The aforementioned effects of the present disclosure and other effects thereof can be understood with the following description and more clearly with the embodiments of the present disclosure. Also, it should easily be understood that the other objectives and advantages of the present disclosure can be implemented by the means described in the claims and the combinations thereof.

DESCRIPTION OF DRAWINGS

Other objects and aspects of the present disclosure will become apparent from the following descriptions of the embodiments with reference to the accompanying drawings in which:

The accompanying drawings illustrate preferred embodiments of the present disclosure and, together with the foregoing disclosure, serve to provide further understanding of the technical features of the present disclosure. However, the present disclosure is not to be construed as being limited to the drawings.

FIG. 3 is a view illustrating a remaining service life of a battery having the history of use as in FIG. 2.

BEST MODE

Figure 1:
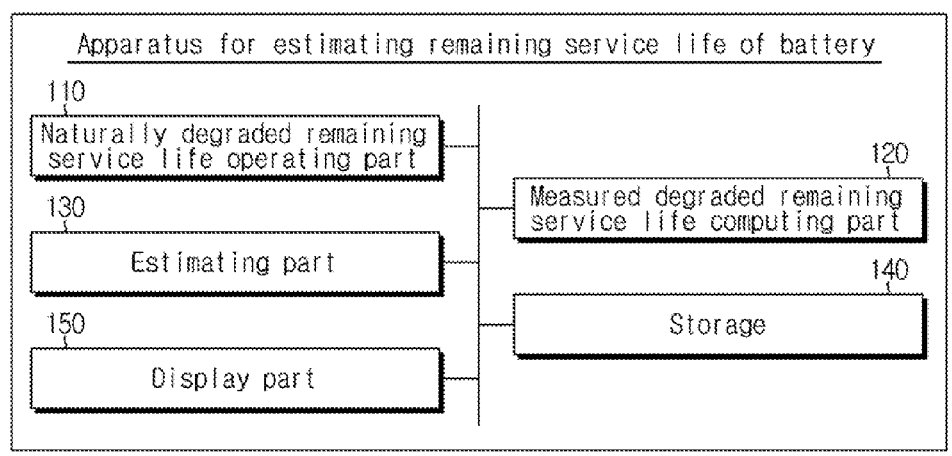
FIG. 1 is a view illustrating a configuration of an apparatus for estimating a remaining service life of a battery according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the embodiments disclosed in the present specification and the configurations illustrated in the drawings are merely the most preferred embodiments of the present disclosure, and not all of them represent the technical ideas of the present disclosure, and thus it should be understood that there may be various equivalents and modified examples that could substitute therefor at the time of filing the present application.

Further, in explaining the present disclosure, any specific explanation on a well-known related configuration or function deemed to obscure the gist of the present disclosure will be omitted.

FIG. 1 is a view illustrating a configuration of an apparatus for estimating a remaining service life of a battery according to an embodiment of the present disclosure.

Referring to FIG. 1, the apparatus for estimating a remaining service life of a battery according to an embodiment of the present disclosure includes a naturally degraded remaining service life computing part 110, a measured degraded remaining service life calculating part 120, and an estimating part 130.

The naturally degraded remaining service life computing part 110 may compute the remaining service life of the battery caused by natural degradation. Here, the natural degradation refers to the battery being naturally degraded in the course of time with the battery not being used. That is, the battery degrades over time from a certain time point, and the remaining service life of the battery caused by natural degradation may be said as the remaining service life of the battery that may be computed when one knows the time elapsed from the certain time point. In other words, the service life of the battery caused by natural degradation may be said to be the remaining service life where not the degradation caused by repeated use of the battery but only the degradation caused by elapse of time is reflected. Such a battery life caused by natural degradation may be called the naturally degraded remaining service life. Further, here, the certain time point may generally be the time point the battery was fabricated, which is a state before the degradation of the battery started (that is, the time point when SOH=100%).

The naturally degraded remaining service life computing part 110 may compute the remaining service life of the battery irrespective of whether the battery is used. That is, the remaining service life of the battery being computed by the naturally degraded remaining service life computing part 110 is irrespective of whether the battery is used, and it is a parameter that depends on elapsed time. Therefore, when the battery is used, there may be some degree of error between the remaining service life of the battery computed by the naturally degraded remaining service life computing part 110 and an actual remaining service life of the battery or a measured degraded remaining service life calculated by measurement that will be explained later on. Especially, when the battery is used, the degradation of the battery would proceed more quickly, and thus the actual remaining service life may generally be smaller than the remaining service life caused by natural degradation.

For example, the naturally degraded remaining service life computing part 110 may compute the naturally degraded remaining service life of the battery using the number of elapsed days from the day the battery was fabricated to the subject day for which the naturally degraded remaining service life of the battery is to be estimated. One skilled in the related art may experimentally measure the remaining service life of the battery by the number of elapsed days, and compile a database with the measurements. Further, the one skilled in the art may prepare a look-up table based on such a database. Therefore, the remaining service life of the battery caused by natural degradation may be easily estimated by a method of referring to the look-up table or the like if one can know the number of elapsed days of the battery.

The number of elapsed days may be easily calculated if there is information on the date the battery was fabricated and information on the subject date for which the naturally degraded remaining service life of the battery is to be estimated. That is, the number of elapsed days may be easily calculated since it is counting the number of days from the date the battery was fabricated to the subject date for which the naturally degraded remaining service life of the battery is to be estimated. Meanwhile, capacity degradation of a battery takes place slowly over a long period of time, and thus hours, minutes and seconds may be disregarded.

The measured degraded remaining service life calculating part 120 calculates the remaining service life of the battery based on a change in various parameters of the battery. The remaining service life of the battery calculated by the measured degraded remaining service life calculating part 120 shall be called the measured degraded remaining service life in order to differentiate it from the naturally degraded remaining service life which is the remaining service life computed by the naturally degraded remaining service life computing part 110.

More specifically, the measured degraded remaining service life calculating part 120 may measure a parameter of the battery, and perform a computing based on the measured parameter. The measured degraded remaining service life calculating part 120 measures the parameter of the battery, senses a change in the measured parameter, and then performs a computing based on the measured parameter to calculate the remaining service life of the battery (measured degraded remaining service life). Here, the parameter used to calculate the measured degraded remaining service life may be a current, a voltage, a state of charge (SOC), an internal resistance or the like. Further, various well known algorithms for estimating a remaining service life may be adopted to the measured degraded remaining service life calculating part 120. Since the measured degraded remaining service life calculating part 120 calculates the remaining service life of the battery via complicated algorithms and computations, it may calculate a remaining service life that is close to the actual remaining service life of the battery compared to the naturally degraded remaining service life computed by the naturally degraded remaining service life computing part 110.

However, the measured degraded remaining service life calculating part 120 has a problem that, when there is no change in the parameter of the battery or the change in the parameter of the battery falls short of a certain degree for enabling measurement of the remaining service life, it cannot calculate the remaining service life of the battery. For example, if the battery is not in use for a long period of time, there would be no change or very little change in the parameter of the battery, and thus it is highly likely that the measured degraded remaining service life calculating part 120 cannot calculate the measured degraded remaining service life.

That is, although the measured degraded remaining service life calculated by the measured degraded remaining service life calculating part 120 provides a very highly reliable remaining service life to the user if it can be calculated, there is a disadvantage that the remaining service life cannot be calculated at all if there is no change in the parameter of the battery.

In this regard, the apparatus for estimating a remaining service life of a battery according to the present disclosure calculates the measured degraded remaining service life when it can calculate the measured degraded remaining service life and provides a very highly reliable remaining service life to the user, but when it cannot calculate the measured degraded remaining service life, it enables providing the naturally degraded remaining service life to the user.

For this purpose, the estimating part 130 estimates the remaining service life of the battery using at least one remaining service life of the naturally degraded remaining service life computed by the naturally degraded remaining service life computing part 110 and the measured degraded remaining service life calculated by the measured degraded remaining service life calculating part 120.

For example, the estimating part 130 may compare a pre-estimated remaining service life value with at least one of the naturally degraded remaining service life value and the measured degraded remaining service life value to estimate the remaining service life with a relatively small value as the remaining service life of the battery. For this purpose, a storage part 140 for storing a remaining service life of a battery may be included in the apparatus for estimating a remaining service life of a battery. That is, in the storage part 140, the pre-estimated remaining service life may be stored. Therefore, the estimating part 130 may estimate the remaining service life of the battery by a method of comparing a result from a previous estimation of a remaining service life of the battery with a result from a current estimation of a remaining service life of the battery, and selecting the remaining service life with a relatively small value as the remaining service life of the battery. Further, the estimating part 130 may update the storage part 140 with the currently estimated remaining service life of the battery, and store the same.

Here, a signal that initiates the estimation of remaining service life of the battery by the estimating part 130 may be the naturally degraded remaining service life being computed by the naturally degraded remaining service life computing part 110 or the measured degraded remaining service life being calculated by the measured degraded remaining service life calculating part 120. That is, the estimating part 130 may perform the estimation of the remaining service life of the battery after the natural degraded remaining service life computing part 110 computes the naturally degraded remaining service life or the measured degraded remaining service life calculating part 120 calculates the measured degraded remaining service life.

For example, in the case where the naturally degraded remaining service life computing part 110 computes the naturally degraded remaining service life according to a predetermined cycle, the naturally degraded remaining service life computing part 110 computes the naturally degraded remaining service life when it reaches the predetermined cycle. Then, the estimating part 130 compares the pre-estimated remaining service life with the naturally degraded remaining service life computed by the naturally degraded remaining service life computing part 110 to estimate a relatively small remaining service life value as the remaining service life of the battery. Likewise, for example, the measured degraded remaining service life calculating part 120 calculates the measured degraded remaining service life when it senses a change in the parameter of the battery. Then, the estimating part 130 performs the estimation of the remaining service life of the battery by an initiating signal which is the calculating of the measured degraded remaining service life being performed by the measured degraded remaining service life calculating part 120. That is, the estimating part 130 compares the pre-estimated remaining service life with the measured degraded remaining service life calculated by the measured degraded remaining service life calculating part 120 to estimate a relatively small remaining service life value as the remaining service life of the battery.

In another example, the estimating part 130 may estimate the minimum value among the pre-estimated remaining service life value, the naturally degraded remaining service life value and the measured degraded remaining service life value as the remaining service life of the battery.

Preferably, the apparatus for estimating a remaining service life of a battery according to an embodiment of the present disclosure may further include a display part 150. The display part 150 plays a role of displaying the remaining service life of the battery estimated by the estimating part 130. The display part 150 may be various output means that enable the user to recognize the remaining service life of the battery. For example, the display part 150 may display the remaining service life of the battery to the user using visual outputs by texts, graphics, video, or combinations thereof, and may display the remaining service life of the battery by adopting other various output means.

Figure 2:
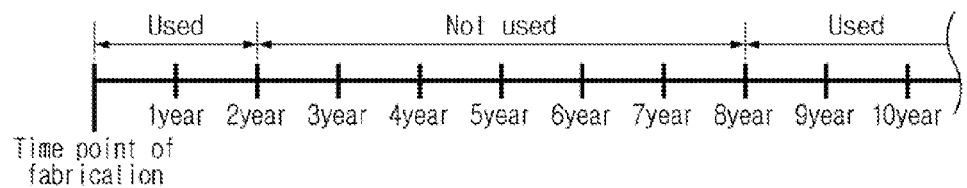
FIG. 2 is a view schematically illustrating an example of a history of use of a battery that repeated being used and not used.

FIG. 2 is a view schematically illustrating an example of a history of use of a battery that repeated being used and not used. Referring to FIG. 2, the battery was used for 2 years since the time point it was fabricated, and from then on, i.e., after those 2 years elapsed, the battery was not-used for 6 years. Then, after those 8 years elapsed, the battery was used again.

FIG. 3 is a view illustrating the remaining service life of a battery having the same history of use as in FIG. 2. The remaining service life of the battery in FIG. 3 is differentiated into an actual remaining service life, a naturally degraded remaining service life and a measured degraded remaining service life, and displayed. Further, such a remaining service life is displayed in units of 1 year. That is, the actual remaining service life, naturally degraded remaining service life and measured degraded remaining service life of the battery at a time point where 1 year elapsed, at a time point where 2 years elapsed, and so on from the time point of fabrication of the battery are respectively displayed.

The naturally degraded remaining service life displayed in FIG. 3 may be a result of measuring the naturally degraded remaining service life of the battery by number of elapsed days by experiment and compiling a database with the measurement. Further, such a naturally degraded remaining service life may be said as the remaining service life derived as a result of computing in the case it is performed by the naturally degraded remaining service life computing part 110 according to an embodiment of the present disclosure.

Further, the measured degraded remaining service life displayed in FIG. 3 may be said as the remaining service life derived as a result of the measurement in the case it is performed by the measured degraded remaining service life calculating part 120 according to an embodiment of the present disclosure. As illustrated in FIG. 3, the error between the actual remaining service life and the measured degraded remaining service life is not great, being 0.01%. That is, when it is possible to measure the measured degraded remaining service life, a very precise remaining service life can be estimated.

Meanwhile, in the example of FIG. 3, an assumption was made that when the battery is not in use for 1 year, the degree of natural degradation is 1%, whereas when the battery is in use for 1 year, the degree of degradation is 1.5%.

Figure 4:
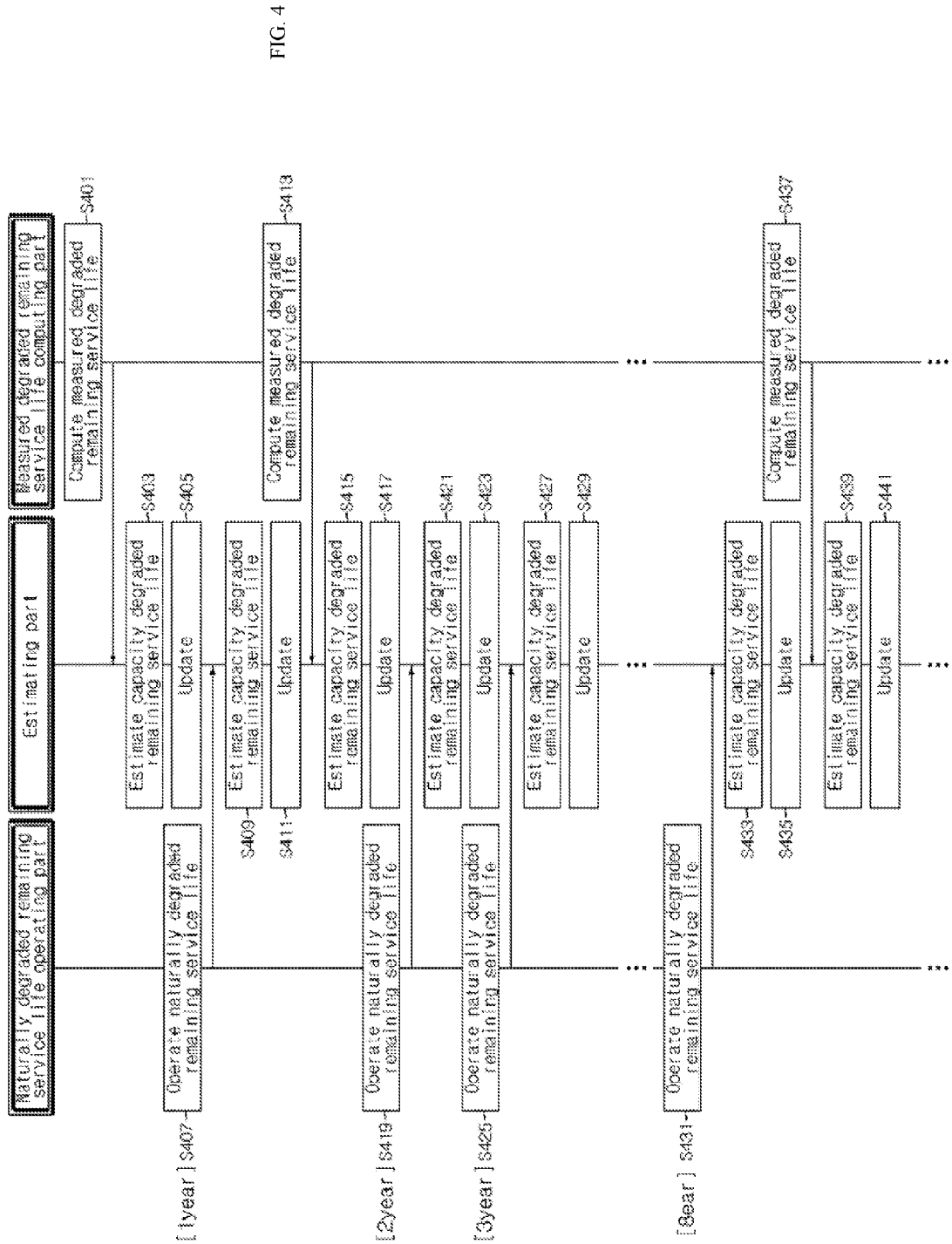
FIG. 4 is a flowchart illustrating an example of a process of estimating a remaining service life of a battery using an apparatus for estimating a remaining service life of a battery according to an embodiment of the present disclosure.

FIG. 4 is a flowchart illustrating an example of a process for estimating a remaining service life of a battery using the apparatus for estimating a remaining service life of a battery according to an embodiment of the present disclosure. The process illustrated in FIG. 4 is a process for estimating the remaining service life of the battery having the same history of use as in FIG. 2 and FIG. 3. Meanwhile, for convenience sake, the process between 4 to 7 years from the time point the battery was fabricated and the process after 9 years elapsed from the time point the battery was fabricated are omitted.

Hereinafter, referring to FIGS. 2 to 4, the process of estimating a remaining service life of the battery using an apparatus for estimating a remaining service life of a battery according to an embodiment of the present disclosure will be explained.

First of all, explanation will be made on 2 years from the time point the battery was fabricated. Since the battery is in use for 1 year from the time point the battery was fabricated, it is possible to calculate the measured degraded remaining service life. Therefore, the measured degraded remaining service life calculating part 120 senses a change in the parameter of the battery, and calculates the measured degraded remaining service life (S401). The estimating part 130 recognizes the measured degraded remaining service life calculated by the measured degraded remaining service life calculating part 120 as an initiating signal, and performs an estimation of a remaining service life of the battery (S403). That is, the pre-estimated remaining service life and the measured degraded remaining service life calculated by the measured degraded remaining service life calculating part 120 are compared to each other. Since the current estimation is the estimation being made for the first time, it may be said that the pre-estimated remaining service life is set to a default value of 100%. The estimating part 130 compares the pre-estimated remaining service life and the measured degraded remaining service life to select a relatively small remaining service life value. Since the pre-estimated remaining service life is 100% and capacity degradation occurred by using the battery, the measured degraded remaining service life would be smaller than 100%, and thus the measured degraded remaining service life will be selected. That is, the estimating part 130 would estimate the measured degraded remaining service life as the remaining service life of the battery. Further, the estimating part 130 updates the storage part 140 with the estimated remaining service life of the battery, and stores the same (S405). Such a process is performed continuously if the battery is in use. That is, although it is illustrated in FIG. 4 that the calculation of measured degraded remaining service life and the estimation of battery remaining service life by the calculation of measured degraded remaining service life are performed once (1), such a process is repeated for 1 year when the battery is in use.

At a time point where 1 year elapses while repeating the estimation of the remaining service life of the battery by the calculation of the measured degraded remaining service life, a computation by the naturally degraded remaining service life computing part 110 is performed (S407). Since the computing cycle of the naturally degraded remaining service life computing part 110 in the present embodiment is 1 year, the naturally degraded remaining service life computing part 110 computes the naturally degraded remaining service life every time 1 year elapses Referring to FIG. 3, the naturally degraded remaining service life at a time point where 1 year elapsed from the time point the battery was fabricated is 99%. When the naturally degraded remaining service life computing part 110 computes a naturally degraded remaining service life as aforementioned, the estimating part 130 recognizes the computation of the naturally degraded remaining service life as an initiating signal, and performs an estimation of a remaining service life of the battery (S409). Since at a time point where 1 year elapsed from the time point the battery was fabricated, the pre-estimated remaining service life of the battery is 98.51% and the naturally degraded remaining service life is 99%, the estimating part 130 selects the pre-estimated remaining service life of the battery (98.51%) which has a relatively smaller remaining service life. Further, the estimating part 130 updates the storage part 140 with the estimated remaining service life of the battery, and stores the same (S411).

After the estimation of the remaining service life of the battery by the computation of the naturally degraded remaining service life is temporarily performed at a time point where 1 year elapsed from the time point of fabrication of the battery, the estimation of the remaining service life of the battery by calculation of the measured degraded remaining service life is repeatedly performed again (S413 to S417 in FIG. 4). Further, when the computing cycle of the naturally degraded remaining service life is reached at a time point where 2 years elapsed, the estimation of the remaining service life of the battery by the computation of the naturally degraded remaining service life is performed (S419 to S423 of FIG. 4). Regarding the above, the aforementioned explanation may be applied just the same, and thus detailed explanation thereof will be omitted.

Meanwhile, for 6 years from the time after 2 years elapsed from the time point the battery was fabricated, the battery is not used. Therefore, for those 6 years, a change in parameter will not occur to the extent to enable a measurement of a remaining service life of the battery. Therefore, the measured degraded remaining service life calculating part 120 cannot calculate a measured degraded remaining service life. For those 6 years, it is only the naturally degraded remaining service life computing part 110 that computes a naturally degraded remaining service life every year which is the computing cycle.

Therefore, the estimating part 130 would estimate a remaining service life of the battery at every computing cycle of the naturally degraded remaining service life computing part 110. First of all, the computing cycle of the naturally degraded remaining service life computing part 110 is reached when 3 years are elapsed from the time point the battery was fabricated. Therefore, the naturally degraded remaining service life computing part 110 computes a naturally degraded remaining service life (S425), and the estimating part 130 estimates a remaining service life accordingly (S427). Here, the pre-estimated remaining service life is the measured degraded remaining service life calculated around the time 2 years elapsed from the time point the battery was fabricated, being 97.01%. Since the naturally degraded remaining service life computed by the naturally degraded remaining service life computing part 110 at the time point where 3 years elapsed is 97%, the naturally degraded remaining service life (97%) which is a relatively small remaining service life value is estimated as the remaining service life of the battery (S427) by the estimating part 130, and the storage part 140 is updated with the estimated remaining service life of the battery, and then stored (S429).

The next computing cycle of the naturally degraded remaining service life computing part 110 is the time point where 4 years elapsed from the time point the battery was fabricated. The pre-estimated remaining service life at the above time point is the naturally degraded remaining service life computed by the naturally degraded remaining service life computing part 110 at a previous computing cycle, being 97%. When the naturally degraded remaining service life computing part 110 performs a computing, the estimating part 130 compares the computed naturally degraded remaining service life and the pre-estimated remaining service life. Since the naturally degraded remaining service life at the time point where 4 years elapsed from the time point the battery was fabricated is 96%, its degree of degradation is greater than the pre-estimated remaining service life. Therefore, at the above time point, the estimating part 130 estimates the naturally degraded remaining service life of 96% as the remaining service life of the battery, and updates the storage part 140 with the estimated remaining service life of the battery, and stores the same.

Such a process is also performed at a time point where 5 years elapsed from the time point the battery was fabricated in the same manner. At the above time point where 5 years elapsed, the storage part 140 estimates the naturally degraded remaining service life of 95% computed by the naturally degraded remaining service life computing part 110 as the remaining service life of the battery, and updates the storage part 140 with the estimated remaining service life of the battery and stores the same. Since the battery continues to be not in use even after that, at a time point where 6 years elapsed from the time point the battery was fabricated, a naturally degraded remaining service life of 94% is selected as the remaining service life of the battery, at a time point where 7 years elapsed from the time point the battery was fabricated, 93% is selected as the remaining service life of the battery, and at a time point where 8 years elapsed from the time point the battery was fabricated, 92% is selected as the remaining service life of the battery. For those 6 years where the battery is not in use, the changed remaining service life of the battery is provided to the user every year. That is, for 1 year right after 2 years elapsed from the time point the battery was fabricated, a remaining service life of 97% is provided to the user; for 1 year right after 3 years elapsed from the time point the battery was fabricated, a remaining service life of 96% is provided to the user; and even after that, a changed remaining service life may be provided to the user at an interval of 1 year.

Meanwhile, right after 8 years elapsed from the time point the battery was fabricated, the battery is used again. Therefore, the measured degraded remaining service life calculating part 120 may sense a change in the parameter of the battery right after the above 8 years elapsed. As a result, the measured degraded remaining service life calculating part 120 calculates the measured degraded remaining service life right after the above 8 years elapsed (S443). Further, the estimating part 130 compares the measured degraded remaining service life calculated by the measured degraded remaining service life calculating part 120 and the pre-estimated remaining service life stored in the storage part 140. Here, the pre-estimated remaining service life is the naturally degraded remaining service life computed by the naturally degraded remaining service life computing part 110 at the time point where 8 years elapsed, that is, 92%. Further, the measured degraded remaining service life calculated by the measured degraded remaining service life calculating part 120 right after the 8 years elapsed from the time point the battery was fabricated is 91.01%. Therefore, the estimating part 130 estimates the measured degraded remaining service life of 91.01% which is the smaller remaining service life value of the two as the remaining service life of the battery (S445), and updates the estimated remaining service life (S447).

Here, what is noteworthy is the difference from when the remaining service life caused by the naturally degraded remaining service life is not reflected when the battery is not in use. If the remaining service life caused by natural degradation is not reflected when the battery is not in use, after 2 years elapsed from the time point the battery was fabricated, the reliability of the remaining service life of the battery being provided to the user deteriorates as time goes by. For example, since the actual remaining service life at the time point where 7 years elapsed from the time point the battery was fabricated is 92% and the measured degraded remaining service life measured by final measurement (at the time point where 2 years elapsed from the time point the battery was fabricated) is 97.01%, the remaining service life of the battery provided to the user is 97.01%. When compared to the actual remaining service life, the remaining service life of the battery being provided to the user has an error of 5.01%, thereby causing the user to have a reduced reliability towards the apparatus for estimating a remaining service life of a battery. More troubling is the fact that the longer the non-use period of the battery, the greater the error.

However, according to the apparatus for estimating a remaining service life of a battery according to an embodiment of the present disclosure, even if the battery is not used, shortening of life caused by natural degradation will continuously be reflected, and thus it is possible to provide the user with a more reliable remaining service life of the battery. That is, the apparatus for estimating a remaining service life of a battery according to an embodiment of the present disclosure provides the remaining service life of 93% at a time point where 7 years elapsed from the time point the battery was fabricated. The remaining service life of 93% has an error of 1% when compared to the actual remaining service life of 92%. That is, the apparatus for estimating a remaining service life of the battery according to an embodiment of the present disclosure has a high reliability compared to when shortening of life caused by natural degradation is not reflected.

However, although the computing cycle of the naturally degraded remaining service life was assumed as being 1 year in the present embodiment, the present disclosure is not limited to such a computing cycle. The computing cycle may have a certain interval of 1 month or 1 week or the like. One skilled in the related art will be able to select an optimal or good computing cycle through a simulation or experiment.

A battery pack according to an aspect of the present disclosure includes at least one battery pack. Especially, the battery pack according an aspect of the present disclosure may further include the aforementioned apparatus for estimating a remaining service life of a battery. Here, the apparatus for estimating a remaining service life of a battery may estimate the remaining service life of one or more batteries included in the battery pack.

Figure 5:
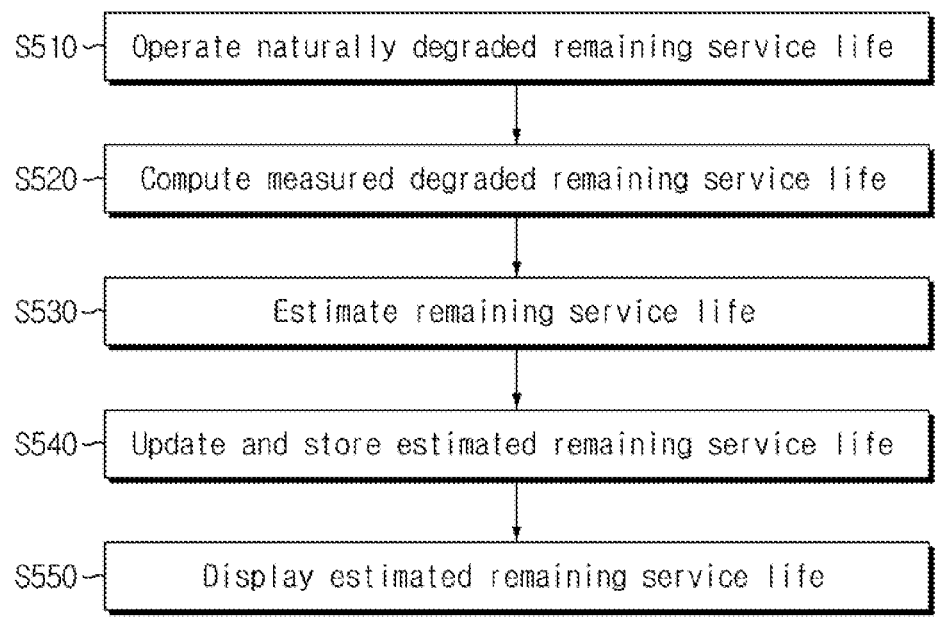
FIG. 5 is a flowchart illustrating a method for estimating a remaining service life of a battery according to an embodiment of the present disclosure.

FIG. 5 is a flowchart illustrating a method for estimating a remaining service life of a battery according to an embodiment of the present disclosure. In FIG. 5, a subject that performs each step may be said to be each configurative element of the aforementioned apparatus for estimating a remaining service life of a battery.

As illustrated in FIG. 5, according to a method for estimating a remaining service life of a battery according to an embodiment of the present disclosure, first of all, a naturally degraded remaining service life is computed (S510). Further, a measured degraded remaining service life is calculated (S520). Specifically, the calculating of a measured degraded remaining service life (S520) may measure a parameter of the battery, sense a change in the measured parameter, and then perform a computation based on the measured parameter to calculate the measured parameter. Next, the remaining service life of the battery is estimated using at least one of the naturally degraded remaining service life and the measured degraded remaining service life (S530). For example, the estimating of the remaining service life of the battery (S530) may compare any one of the naturally degraded remaining service life and the measured degraded remaining service life with a pre-estimated remaining service life to select a relatively small remaining service life value as the remaining service life value of the battery, and estimate the remaining service life value of the battery.

Subsequently, when the remaining service life of the battery is estimated, the estimated remaining service life of the battery may be updated and stored (S540). Further, when the remaining service life of the battery is estimated, the estimated remaining service life of the battery may be displayed (S550).

Preferably, the computing of a naturally degraded remaining service life (S510) may compute the naturally degraded remaining service life according to a pre-determined cycle, and the calculating of a measured degraded remaining service life (S520) may calculate the measured degraded remaining service life when a change is sensed in the parameter, and the estimating of the remaining service life of the battery (S530) may estimate the remaining service life of the battery when the naturally degraded remaining service life is computed at the computing of a naturally degraded remaining service life (S510) or when the measured degraded remaining service life is calculated at the calculating of a measured degraded remaining service life (S520).

In addition, preferably, the computing of the naturally degraded remaining service life (S510) may calculate the number of days elapsed from the day the battery was fabricated until the subject day for which the remaining service life is to be estimated using information on the date of fabrication of the battery and information on the date of the subject day for which the remaining service life of the battery is to be estimated, and compute the naturally degraded remaining service life of the battery using the calculated number of days elapsed.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

The characteristics described in the individual exemplary embodiments of the present disclosure may be implemented in combination into one single embodiment. In contrast, a variety of characteristics described herein as a single exemplary embodiment may be individually implemented in a variety of exemplary embodiments, or implemented in a proper subcombination.

Meanwhile, although the present specification used terms of 'part' such as in 'naturally degraded remaining service life computing part', 'measured degraded remaining service life calculating part', 'estimating part' or the like, it is obvious to one skilled in the related art that those terms represent logical configuration units, and not necessarily configurative elements that can be physically separated.

What is claimed is:

1. An apparatus for estimating a remaining service life of a battery, the apparatus is configured to:
   compute the naturally degraded remaining service life that represents the remaining service life of the battery where a naturally degraded degree is reflected;
   calculate the measured degraded remaining service life that represents the remaining service life of the battery calculated by measuring a parameter of the battery, sensing a change in the measured parameter due to the battery being used, calculating an updated measured parameter and then performing a computation based on the updated measured parameter;
   perform a first estimation of the remaining service life of the battery to be the lower of a pre-estimated remaining service life value and the measured degraded remaining service life only when the change is sensed in the parameter and update the remaining service life of the battery to be the first estimation of the remaining service life, wherein the pre-estimated remaining service life value is a previous estimation of the remaining service life of the battery; and then perform a second estimation of the remaining service life of the battery to be the lower of the updated remaining service life value and the naturally degraded service life, and update the remaining service life of the battery to be the second estimation of the remaining service life, wherein the parameter comprises any one of a current, a voltage, an SOC and an internal resistance, and wherein the apparatus is configured to compute the naturally degraded remaining service life according to a pre-determined cycle, calculate the updated measured degraded remaining service life after each predetermined cycle only when the change is sensed in the parameter, estimate the remaining service life of the battery after computing the naturally degraded remaining service life according to the pre-determined cycle and estimate the remaining service life of the battery after calculating the updated measured degraded remaining service life only when the change is sensed in the parameter.

2. The apparatus of claim 1, wherein the apparatus is further configured to store the remaining service life of the battery in memory.

3. The apparatus of claim 2, wherein the apparatus is configured to update the memory with the estimated remaining service life of the battery.

4. The apparatus of claim 1, wherein the apparatus is configured to calculate the number of days elapsed from the day the battery was fabricated until a subject day for which the remaining service life is to be estimated using information on a date of fabrication of the battery and information on a date of the subject day for which the remaining service life of the battery is to be estimated, and compute the naturally degraded remaining service life of the battery using the calculated number of days elapsed.

5. The apparatus of claim 1, further comprising a display part configured to display the remaining service life of the battery estimated.

6. The apparatus of claim 5, wherein the remaining service life of the battery is expressed in a percentage with respect to an initial service life of the battery.

7. A battery pack comprising the apparatus configured to estimate a remaining service life of a battery according to claim 1.

8. The method of claim 1, further comprising storing the estimated remaining service life of the battery in memory.

9. The method of claim 8, wherein the storing the remaining service life of the battery updates the estimated remaining service life of the battery.

10. A method for estimating a remaining service life of a battery, the method comprising:

computing a naturally degraded remaining service life that represents the remaining service life of the battery where a naturally degraded degree is reflected;

calculating a measured degraded remaining service life that represents the remaining service life of the battery calculated by measuring a parameter of the battery, sensing a change in the measured parameter due to the battery being used, calculating an updated measured parameter and then performing a computation based on the updated measured parameter;

performing a first estimation of the remaining service life of the battery to be the lower of a pre-estimated remaining service life value and the measured degraded remaining service life only when the change is sensed in the parameter, and updating the remaining service life of the battery to be the first estimation of the remaining service life, wherein the pre-estimated remaining service life value is a previous estimation of the remaining service life of the battery; and then performing a second estimation of the remaining service life of the battery to be the lower of the updated remaining service life value and the naturally degraded service life, and updating the remaining service life of the battery to be the second estimation of the remaining service life;

wherein the parameter comprises any one of a current, a voltage, an SOC and an internal resistance, and wherein the naturally degraded remaining service life is computed according to a pre-determined cycle, the measured degraded remaining service life is calculated after each predetermined cycle only in response to the change being sensed in the parameter, the remaining service life of the battery is estimated after computing the naturally degraded remaining service life according to the pre-determined cycle and the remaining service life of the battery is estimated after calculating the measured degraded remaining service life only in response to the change sensed in the parameter.

11. The method of claim 10, wherein the computing the naturally degraded remaining service life calculates the number of days elapsed from the day the battery was fabricated until a subject day for which the remaining service life is to be estimated using information on a date of fabrication of the battery and information on a date of the subject day for which the remaining service life of the battery is to be estimated, and computes the naturally degraded remaining service life of the battery using the calculated number of days elapsed.

12. The method of claim 10, further comprising displaying the estimated remaining service life of the battery.

13. The method of claim 12, wherein the remaining service life of the battery is expressed in a percentage with respect to an initial service life of the battery.

* * * * *